(12) United States Patent
Garza et al.

(10) Patent No.: US 7,901,852 B2
(45) Date of Patent: Mar. 8, 2011

(54) METROLOGY OF BILAYER PHOTORESIST PROCESSES

(75) Inventors: Cesar M. Garza, Poughkeepsie, NY (US); Sungseo Cho, Sturbridge, MA (US)

(73) Assignee: Freescale Semiconductor, Inc., Austin, TX (US)

( * ) Notice: Subject to any disclaimer, the term of this patent is extended or adjusted under 35 U.S.C. 154(b) by 379 days.

(21) Appl. No.: 12/074,148

(22) Filed: Feb. 29, 2008

(65) Prior Publication Data

US 2009/0220895 A1 Sep. 3, 2009

(51) Int. Cl.
*G03F 9/00* (2006.01)
*G03C 5/00* (2006.01)
*G06K 9/00* (2006.01)

(52) U.S. Cl. ........... 430/30; 430/292; 430/313; 430/323; 382/145; 382/149; 382/151

(58) Field of Classification Search .................... 430/30, 430/292, 313, 323; 382/145, 149, 151
See application file for complete search history.

(56) References Cited

U.S. PATENT DOCUMENTS

| | | | |
|---|---|---|---|
| 6,132,644 A * | 10/2000 | Angelopoulos et al. | 252/500 |
| 6,858,542 B2 | 2/2005 | Sparks et al. | |
| 7,052,812 B1 * | 5/2006 | Wang et al. | 430/18 |
| 7,102,656 B2 * | 9/2006 | Mirkin et al. | 346/140.1 |
| 7,166,241 B1 * | 1/2007 | Angelopoulos et al. | 252/500 |
| 7,226,740 B2 | 6/2007 | Haugland et al. | |
| 2006/0122366 A1 | 6/2006 | Wang et al. | |
| 2007/0249803 A1 | 10/2007 | Mattes et al. | |
| 2007/0295398 A1 | 12/2007 | On Too et al. | |
| 2008/0017834 A1 | 1/2008 | Skulason et al. | |
| 2008/0023677 A1 | 1/2008 | Frechet et al. | |
| 2008/0033146 A1 | 2/2008 | Liu et al. | |

* cited by examiner

*Primary Examiner* — Christopher G Young
(74) *Attorney, Agent, or Firm* — John A. Fortkort; Fortkort & Houston P.C.

(57) ABSTRACT

A method for patterning a substrate is provided, which comprises (a) providing a substrate; (b) applying a first layer comprising a first photo resist to the substrate; (c) applying a second layer comprising a second photo resist over the first layer; (d) patterning the second layer; and (e) inspecting the patterned second layer with an inspection tool; wherein at least one of the first and second layers comprises a contrasting agent which increases the contrast between the first and second layers to the inspection tool.

23 Claims, 2 Drawing Sheets

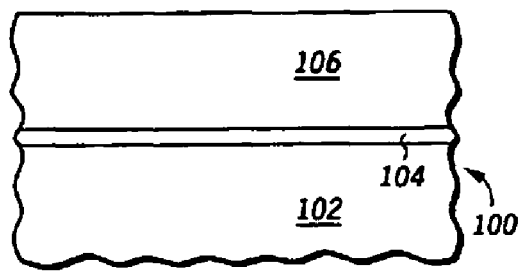
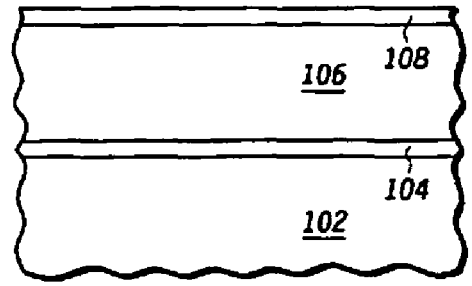
*FIG.1*  *FIG.2*
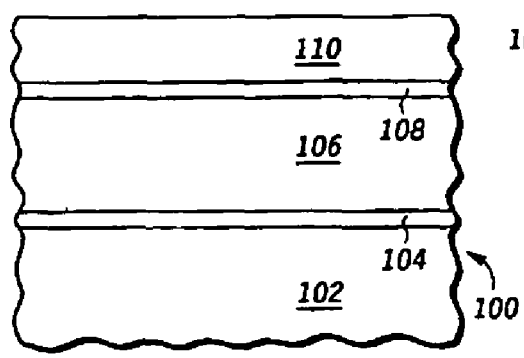
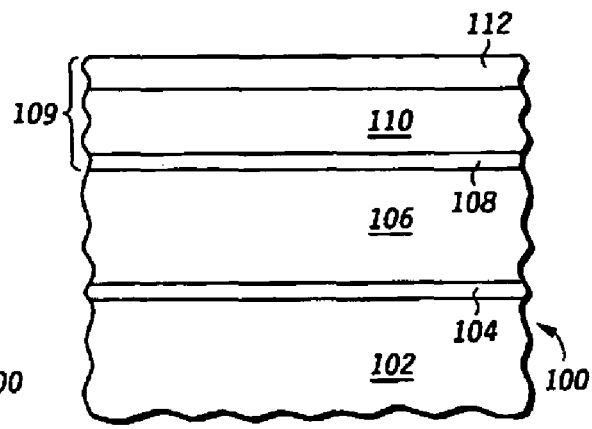
*FIG.3*  *FIG.4*
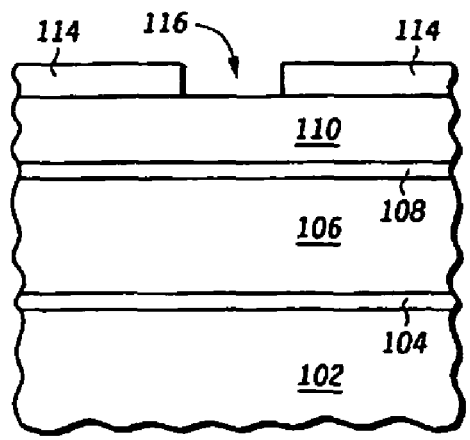
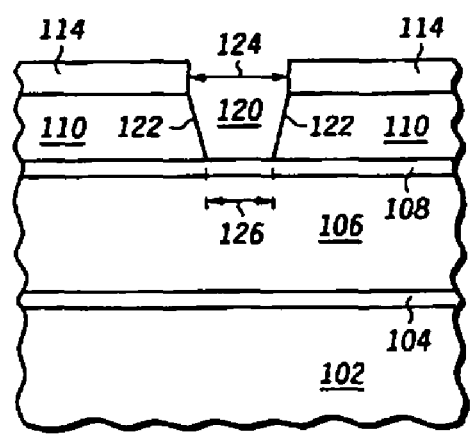
*FIG.5*  *FIG.6*

METROLOGY OF BILAYER PHOTORESIST PROCESSES

FIELD OF THE DISCLOSURE

The present disclosure relates generally to semiconductor processes, and more particularly to methods for inspecting bilayer photoresist structures.

BACKGROUND OF THE DISCLOSURE

Typical lithographic processes involve formation of a patterned resist layer by patternwise exposing a radiation-sensitive resist to an imaging radiation. The image is subsequently developed by contacting the exposed resist layer with a material (typically an aqueous alkaline developer) to selectively remove portions of the resist layer, thereby obtaining the desired pattern. The pattern so obtained is subsequently transferred to an underlying material by etching the material through the openings of the patterned resist layer. After the transfer is complete, the remaining resist layer is then removed.

The resolution capability of lithographic processes is generally a function of the wavelength of imaging radiation, the quality of the optics in the exposure tool and the thickness of the imaging resist layer. As the thickness of the imaging resist layer increases, the resolution capability decreases. Thinning of a conventional single layer resist to improve resolution generally results in compromise of the etch resistance of the resist which is needed to transfer the desired image to the underlying material layer.

In order to obtain the resolution enhancement benefit of thinner imaging layers without compromising the etch resistance of the resist, bilayer lithographic processes have been developed which feature a thin imaging resist layer (typically a silicon-containing resist) disposed on a thicker planarizing layer. The thinness of the imaging resist layer allows a pattern to be imparted to it with high resolution. This pattern is then transferred to the thicker planarizing layer. The patterned planarizing layer is then utilized as an etch mask to etch the substrate. Since the pattern planarizing layer may be substantially thicker than the imaging layer, it provides greater etch resistance. Hence, the use of a bilayer photoresist provides resolution enhancement without an associated decrease in etch resistance.

BRIEF DESCRIPTION OF THE DRAWINGS

FIG. 1 is an illustration of a semiconductor structure as it appears at one step in a process in accordance with a particular, non-limiting embodiment of the methodology described herein.

FIG. 2 is an illustration of a semiconductor structure as it appears at one step in a process in accordance with a particular, non-limiting embodiment of the methodology described herein.

FIG. 3 is an illustration of a semiconductor structure as it appears at one step in a process in accordance with a particular, non-limiting embodiment of the methodology described herein.

FIG. 4 is an illustration of a semiconductor structure as it appears at one step in a process in accordance with a particular, non-limiting embodiment of the methodology described herein.

FIG. 5 is an illustration of a semiconductor structure as it appears at one step in a process in accordance with a particular, non-limiting embodiment of the methodology described herein.

FIG. 6 is an illustration of a semiconductor structure as it appears at one step in a process in accordance with a particular, non-limiting embodiment of the methodology described herein.

DETAILED DESCRIPTION

Figure 7:
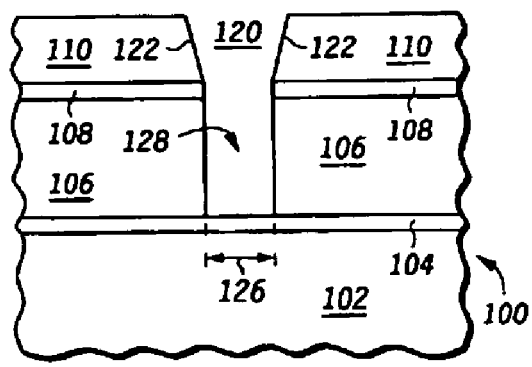
FIG. 7 is an illustration of a semiconductor structure as it appears at one step in a process in accordance with a particular, non-limiting embodiment of the methodology described herein.

In one aspect, a method for patterning a substrate is provided, which comprises (a) providing a substrate; (b) applying a first layer comprising a first photo resist to the substrate; (c) applying a second layer comprising a second photo resist over the first layer; (d) patterning the second layer; and (e) inspecting the patterned second layer with an inspection tool; wherein at least one of the first and second layers comprises a contrasting agent which increases the contrast between the first and second layers to the inspection tool. The contrasting agent may be an optical contrasting agent (in the case of an optical inspection tool) or an electrical contrasting agent (in the case of an e-beam inspection tool).

In a typical semiconductor fabrication process, it is desirable to inspect the photomask for defects before it is used to etch the substrate. Such defects may include, for example, scratches, process variations, repeating pattern defects, and particles which are randomly localized on the photomask surface. If a bilayer photoresist is used in the fabrication process, this inspection typically occurs after the image has been defined in the planarizing layer, but before the image has been imparted to the substrate. Inspection of the photomask at this point in the process allows any defects to be corrected before these defects are transferred to the substrate. A variety of optical and electronic inspection tools have been developed in the art for this purpose.

It is desirable for an inspection system or technique to detect defects as rapidly and efficiently as possible. In particular, it is important from a processing standpoint that the time required to load the specimen into the inspection tool, characterize any defects in the photomask, and remove the specimen from the inspection tool be a short as possible. On the other hand, the movement toward increasingly greater feature densities in semiconductor requires inspection tools to be able to ascertain defects on an increasingly smaller scale. These competing goals have created a need in the art for inspection techniques which can ascertain defects in increasingly smaller features without reducing the speed of the inspection process.

Despite the previously noted advantages of bilayer photoresist processes, the commercial implementation of such processes has been hindered by the lack of an available inspection process that can reliably and speedily measure defects immediately following the printing of the imaging layer. The current lack of a suitable inspection process arises in part from the lack of contrast between the imaging layer and the planarizing layer in bilayer constructs and, in some applications, from the lack of contrast between the bilayer construct and the underlying substrate.

Without wishing to be bound by theory, this result is believed to arise from the fact that the dielectric constants of the materials of the imaging layer and the planarizing layer are typically high, and are also typically very similar. Therefore, the imaging layer and the planarizing layer exhibit very little electrical contrast (that is, they exhibit very little difference in charging levels). Since e-beam inspection tools rely on electrical contrast to distinguish between the layers in a structure being inspected, these tools have significant difficulty distinguishing between the layers in a bilayer photoresist, thus resulting in a reduction in the precision and accuracy with which the inspection tool can measure critical dimensions. This problem is exacerbated by the high throughputs and fine feature sizes characteristic of a modern semiconductor fabrication process.

An analogous problem is encountered with optical inspection tools. Here, the issue is that the indices of refraction of the imaging layer and the planarizing layer are also typically very close, and the adsorption of actinic radiation by the imaging layer and planarizing layer are very similar. Since an optical inspection tool typically relies on differences in refractive index or adsorption to distinguish between two layers in a specimen being inspected, the use of bilayer photoresists also leads to a reduction in the precision and accuracy with which the inspection tool can measure critical dimensions.

It has now been found that the foregoing problems in the art may be overcome by adjusting the composition of the planarizing layer and/or the imaging layer such that suitable contrast exists between the two of them under inspection conditions, thereby allowing these layers to be distinguished from each other by e-beam or optical inspection tools. The preferred means by which such contrast is achieved may depend, in part, on whether an optical inspection tool or in e-beam inspection tool is being utilized.

In a preferred embodiment where an optical inspection tool is being utilized, suitable contrast may be achieved by adding an optical contrasting agent to at least one of the layers in the bilayer photoresist. Preferably, this optical contrasting agent is a dye which is added to the planarizing layer, and more preferably is a dye that fluoresces at the wavelength of the actinic radiation utilized in the inspection process. The addition of such a die to the planarizing layer greatly improves the contrast between the imaging layer and the planarizing layer in the inspection tool (typically a scanning electron microscope (SEM)), thus significantly increasing the accuracy and precision of the measurements made with the tool.

In a preferred embodiment where an e-beam inspection tool is being utilized to inspect the construct, suitable contrast may be achieved by adding an electrical contrasting agent to one of the layers in the bilayer photoresist. Preferably, this electrical contrasting agent is added to the planarizing layer, and is a material which increases the conductivity of the planarizing layer. The addition of such a material to the planarizing layer greatly improves the contrast between the imaging layer and the planarizing layer under inspection conditions, thus significantly increasing the accuracy and precision of the measurements made with the inspection tool.

The methodologies and structures disclosed herein may be further appreciated with respect to the particular, non-limiting embodiment depicted in FIGS. 1-8, which illustrate a semiconductor fabrication processing sequence in accordance with the teachings herein. It is to be noted that these drawings are not drawn to scale, and have been simplified to more clearly illustrate the embodiment depicted therein.

FIG. 1 is a partial, cross-sectional view of a semiconductor wafer 100 at an intermediate stage in the fabrication of an integrated circuit. As seen therein, wafer 100 includes a substrate 102 over which an etch stop layer (ESL) 104 and a dielectric layer 106 have been formed. Substrate 102 may be a monocrystalline silicon substrate or other semiconductor substrate that has been processed to include a plurality of electronic devices therein, e.g., p-channel and n-channel metal-oxide-semiconductor field effect transistors (MOSFETs) and interspersed transistor isolation structures. In addition, substrate 102 may include one or more interconnect layers and one or more layers of interlevel dielectrics (ILDs).

ESL 104 is preferably a silicon-nitride (SiN) or carbon doped silicon-nitride (SiCN) layer which will typically have a thickness of approximately 500 Å. The silicon nitride may be deposited by plasma enhanced chemical vapor deposition (PECVD) using a plasma from ammonium and silane in a CVD reactor chamber maintained at a temperature in the range of approximately 300 to 500° C. Carbonated silicon nitride may be used in lieu of conventional silicon nitride when a lower dielectric constant material is desirable.

Dielectric layer 106 may include approximately 3000 to 9000 Å of an electrically insulating material such as silicon oxide ($SiO_2$) or carbonated silicon oxide (SiCOH). Dielectric 106 may serve as an ILD layer between a pair of interconnects (not shown) disposed above and below it. In embodiments where layer 106 comprises silicon dioxide, this layer may be formed through CVD by decomposing tetraethylorthosilicate (TEOS), by reacting silane and oxygen, by reacting dichlorosilane and nitrous oxide, or by other suitable CVD oxide techniques as are known to the art. In embodiments where layer 106 comprises SiCOH, this layer may be employed as a low-K dielectric (a material having a dielectric constant of less than approximately 3.0) where it is desirable to reduce intralayer and interlayer capacitive coupling effects. Of course, both layers may be of other thicknesses and materials in other embodiments.

Turning now to FIG. 2, a capping layer 108 is formed over dielectric layer 106. The capping layer 108 may comprise, for example, TEOS-based silicon oxide having a thickness of approximately 800 Å. The use of a capping layer 108 has at least two advantages. Firstly, the dielectric layer 106, when serving as an ILD, is typically subjected to some form of planarization process such as a chemical mechanical polish (CMP) process. Following the planarization, the deposition of capping layer 108 may be used to achieve a desired final ILD thickness where the final ILD includes dielectric layer 106 and capping layer 108. Secondly, in embodiments where dielectric layer 106 is (or includes) a low-K material such as SiCOH, a relatively thin capping layer 108 may provide a more stable film on which subsequent layers may be formed.

With reference now to FIGS. 3-4, a bilayer photoresist film (BLR film) 109 is formed over capping layer 108. BLR film 109 is a temporary film which is removed before completion of the fabrication process. BLR film 109 includes a relatively thick light absorbing, typically polymeric planarizing layer (PL) 110 and a relatively thin imaging layer (IL) 112. IL 112 may be, for example, a silicon-containing photoresist imaging layer having a silicon content of approximately 6 to 15 percent by weight. PL 110 may be a photo-insensitive polymer. As described in greater detail below, PL 110 is preferably formulated with a contrasting agent (which may be an electrical contrasting agent or an optical contrasting agent, depending on the type of inspection tool being utilized) to facilitate subsequent inspection of the patterned IL 112.

The use of a bilayer photoresist helps to compensate for the reduced depth of focus characteristic of photolithography systems that employ short imaging wavelengths (248 nm or less) and large numerical aperture (NA) lenses. Such systems are almost universally employed to produce geometries of 100 nm or less. In these systems, reducing the photoresist thickness to compensate for the reduced depth of focus is of limited effectiveness. Moreover, if the resist is too thin, it cannot serve as a pattern transfer mask during the subsequent etch of the wafer. The use of bilayer photoresists addresses this problem by providing a thin film imaging layer and a thick, photo insensitive planarizing layer. After patterning the imaging layer, the resulting pattern is transferred into the thick planarizing layer using a special etch process that etches the planarizing layer without substantially etching the imaging layer or the underlying substrate. An example of a commercially available bilayer photoresist is the SiBER™ photoresist system available commercially from Shipley Company, LLC.

In the particular embodiment depicted in FIGS. 3-4, BLR film 109 is formed by first coating wafer 100 with PL 110. The thickness of PL 110 is preferably in the range of 3500 to 15000 Å, though this thickness could be different in other embodiments. The coated PL is then typically baked at a temperature in the range of approximately 150 to 250° C. to cross-link the polymeric material and to mechanically harden the film. Following the bake of PL 110, IL 112 is coated over PL 110. The thickness of IL 112 is preferably within the range of about 500 to about 3000 Å, though this thickness could be different in other embodiments. After coating the wafer with the imaging layer, IL 112 is baked at a temperature (preferably in the range of 90 to 140° C.) to form BLR film 109 as depicted in FIG. 4.

The IL 112 is then exposed to imaging radiation through a conventional photomask and submersed in a suitable photoresist developing solution to selectively remove portions of IL 112 and to create a patterned IL 114 as shown in FIG. 5. The exposure of IL 112 may be performed, for example, with 248 nm or 193 nm lithography equipment. Patterned IL 114 defines a void or printed feature 116. The photolithographic processing of the imaging layer to produce patterned IL 114 leaves PL 110 substantially intact since PL 110 is not photosensitive.

At this point in the process, the patterned IL 114 is subject to inspection to identify any defects therein, and any remedial action suggested by the inspection process is taken. As previously noted, the inspection process may utilized e-beam or optical inspection tools.

Referring now to FIG. 6, the printed feature 116 in patterned IL 114 is transferred into PL 110 by processing PL 110 to create a void (referred to herein as tapered wall via 120) in PL 110. Preferably, processing referred to herein as dry develop processing is used to transfer printed feature 116 into PL 110. The dry develop processing of PL 110 employs chemistry and processing conditions that produce a tapered wall via 120 in PL 110 where tapered wall via 120 is characterized (as its name suggests) by tapered or sloping sidewalls 122. Sidewalls 122 are characteristically sloped at an angle between roughly 70° to 89° (relative to an upper surface of the underlying substrate) and substantially straight (as seen in cross section).

The dry develop processing of PL 110 may be carried out in a conventional plasma etch chamber such as a chamber used to dry etch silicon oxide. A high density $N_2$ plasma (that is a plasma having an ion density in excess of approximately $10^{11}$ ions/cm$^3$) at low pressure (that is, a pressure of 15 mT or less) may be utilized for the dry develop processing of PL 110 to produce tapered wall via 120 as depicted in FIG. 6. The dry develop processing may, for example, use an RF source power of 500 to 2500 W, an RF bias power of 50 to 200 W, an $N_2$ flow of 20 to 100 sccm, a chamber pressure of 3 to 15 mT, and a wafer temperature of −10 to 10° C.

The formation of tapered wall via 120 provides at least two primary benefits. First, tapered wall via 120 may be used to form a final feature having a minimum feature size that is less than the minimum feature size that the photolithography can print. If the printed feature 116 in patterned IL 114 has a dimension that is roughly the minimum feature size that the stepper can print, the tapered wall via 120 will result in an integrated circuit feature formed in the underlying wafer with a minimum dimension that is less than the printable minimum dimension. The tapered wall via 120 can also be used to reduce the number of fatal defects by enabling a relaxation of the photolithography parameters without effecting the performance or die size of the finished device. More specifically, tapered wall via can be used in conjunction with a photolithography process that prints features 116 with a dimension that is greater than the minimum dimension specified for feature 116. After completing the wafer etch processing, the feature produced in the wafer will have a minimum feature that is comparable to the minimum feature specified for feature 116. Of course, it will be appreciated that embodiments of the foregoing type are also possible in accordance with the teachings herein which do not have a tapered wall.

Referring to FIG. 7, a feature 128 of the integrated circuit is formed in wafer 100 using an anisotropic etch process with PL 110 (and IL 112) as an etch mask after the dry develop processing of UL 110. Typically, a fluorine-based reactive ion etch (RIE) process is used to form integrated circuit feature 128. In the depicted embodiment, feature 128 is a via formed in the underlying dielectric 106 and capping layer 108. In alternative embodiments, a similarly processed void may serve as a trench from which an interconnect may be formed using a damascene process. The typically silicon-containing IL 114 may be etched away during such an etch process, leaving only the PL 110 over the wafer 100 including feature 128 as shown in FIG. 7. The etch process used will desirably produce substantially vertical sidewalls such that the finished dimension of void 120 is transferred into the underlying films. Thus, as shown in FIG. 7, feature 128 has a finished feature size (126) that is substantially equal to the finished dimension of tapered wall via 120 in PL 110.

Figure 8:
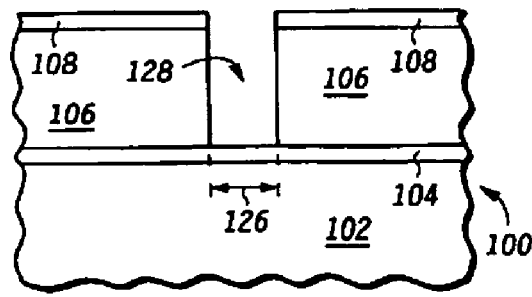
FIG. 8 is an illustration of a semiconductor structure as it appears at one step in a process in accordance with a particular, non-limiting embodiment of the methodology described herein.

Referring to FIG. 8, any remaining portions of PL 110 are stripped from wafer 100 using a conventional photoresist strip solution. At this stage, wafer 100 is in condition for subsequent processing (not depicted) such as a metal deposition processing to fill feature 128 with a conductive material that may serve as a contact or an interconnect.

As previously noted, in the foregoing process, PL 110 is preferably formulated with a contrasting agent (which may be an electrical contrasting agent if an e-beam inspection tool is to be utilized, or an optical contrasting agent if an optical inspection tool is to be utilized) to facilitate subsequent inspection of the photomask. Some possible chemistries and features of these contrasting agents are described below.

Various electrical contrasting agents may be utilized in the structures and methodologies described herein. These include, without limitation, organic semiconductors, including charge transfer complexes and conductive polyacetylenes (the latter including polyacetylene itself, as well as polypyrrole, polyaniline, and derivatives of these materials). Suitable organic semiconductor materials may include both short chain (oligomers) and long chain (polymeric) materials. Specific examples of semiconducting oligomers include, but are not limited to, pentacene, anthracene and rubrene (5,6,11,12-tetraphenylnaphthacene). Specific examples of semiconducting polymers include, but are not limited to, poly(3-hexylthiophene), poly(p-phenylene vinylene), F8BT, polyacetylene, and various derivatives of the foregoing.

The preferred electrical contrasting agents for use in the structures and methodologies described herein are preferably highly conjugated materials with delocalized electrons. One especially preferred class of such materials are polymers derived from aniline monomers. These include polyaniline salts and polyaniline bases of the types depicted in FORMULA 1 and FORMULA 2, respectively:

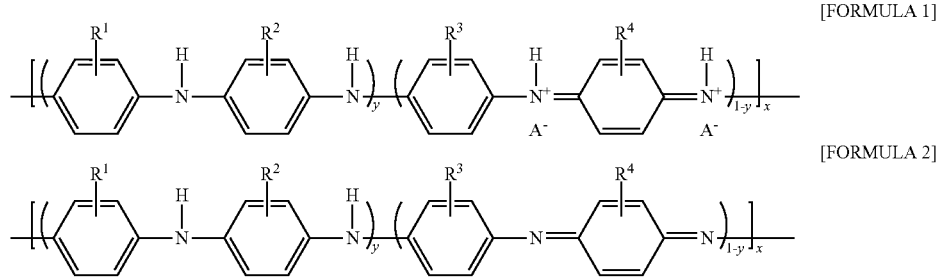

[FORMULA 1]

[FORMULA 2]

Other especially preferred classes of such materials are polypyrroles (FORMULA 3) and polythiophenes (FORMULA 4).

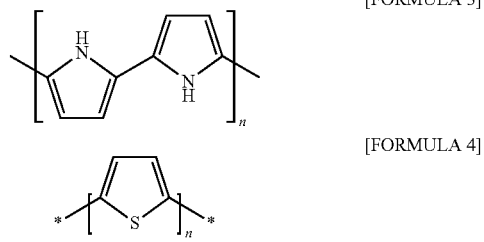

[FORMULA 3]

[FORMULA 4]

In some embodiments, the electrical contrasting agents used in the structures and methodologies described herein may be oligomers or polymers derived from one or more precursor monomers selected from the group consisting of thiophenes, selenophenes, tellurophenes, pyrroles, anilines, and polycyclic aromatics. The polymers made from these monomers are, accordingly, polythiophenes, poly(selenophenes), poly(tellurophenes), polypyrroles, polyanilines, and polycyclic aromatic polymers, respectively. The rings in the polycyclic aromatic monomers may be joined by one or more bonds, or they may be fused together. In one specific embodiment, the polycyclic aromatic polymers are poly(thienothiophenes).

In some embodiments, the electrical contrasting agents used in the structures and methodologies described herein may be oligomers or polymers derived from monomers of the type depicted in FORMULA 5 below:

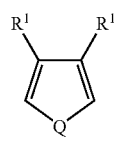

FORMULA 5 wherein:
Q is selected from the group consisting of S, Se, and Te;
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent species such as nitrogen, selenium, tellurium, sulfur or oxygen atoms.

In other embodiments, both $R^1$ together may form —O—$(CHY)_m$—O— linkages, where m is 2 or 3, and Y is the same or different at each occurrence and is selected from the group consisting of hydrogen, halogen, alkyl, alcohol, amidosulfonate, benzyl, carboxylate, ether, ether carboxylate, ether sulfonate, ester sulfonate, and urethane. In some embodiments, some or all of the Y groups may be partially or fully fluorinated. In other embodiments, all Y may be hydrogen. In some embodiments, the polymer is poly(3,4-thylenedioxythiophene). In other embodiments, at least one Y group is not hydrogen. In still other embodiments, at least one Y group is a substituent having F substituted for at least one hydrogen. In some such embodiments, at least one Y group is perfluorinated.

In still other embodiments, the electrical contrasting agents used in the structures and methodologies described herein may be oligomers or polymers derived from monomers of the type depicted in FORMULA 6:

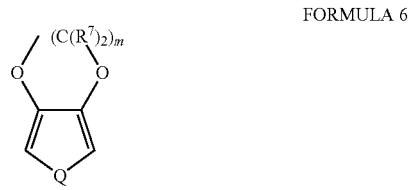

FORMULA 6 wherein:
Q is selected from the group consisting of S, Se, and Te;
$R^7$ is the same or different at each occurrence and is selected from the group consisting of hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, and m is 2 or 3.

In one possible embodiment of FORMULA 6, m=2, one $R^7$ is an alkyl group of more than 5 carbon atoms, and all other $R^7$ are hydrogen. In some embodiments of FORMULA 6, at least one $R^7$ group is fluorinated. In other embodiments, at least one $R^7$ group has at least one fluorine substituent. In still other embodiments, the $R^7$ group is fully fluorinated.

In one embodiment of FORMULA 6, the $R^7$ substituents on the fused alicyclic ring on the monomer offer improved solubility of the monomers in water and facilitate polymerization in the presence of the fluorinated acid polymer.

In some embodiments of FORMULA 6, m=2, one $R^7$ is sulfonic acid-propylene-ether-methylene, and all other $R^7$ are hydrogen. In other embodiments, m=2, one $R^7$ is propyletherethylene, and all other $R^7$ are hydrogen. In still other embodiments, m=2, one $R^7$ is methoxy, and all other $R^7$ are hydrogen. In further possible embodiments, one $R^7$ is sulfonic acid difluoromethylene ester methylene ($-CH_2-O-C(O)CF_2-SO_3H$), and all other $R^7$ are hydrogen.

In some embodiments, the electrical contrasting agents used in the structures and methodologies described herein may be oligomers or polymers derived from pyrrole monomers of the type depicted in FORMULA 7 below:

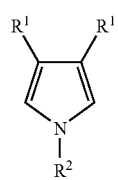

FORMULA 7 wherein:

$R^1$ is independently selected so as to be the same or different at each occurrence and is selected from the group consisting of hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both R1 groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms; and $R^2$ is independently selected so as to be the same or different at each occurrence and is selected from the group consisting of hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

In some embodiments, $R^1$ is the same or different at each occurrence and is independently selected from the group consisting of hydrogen, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In some embodiments, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In some embodiments, the pyrrole monomer is unsubstituted and both $R^1$ and $R^2$ are hydrogen.

In some embodiments, both $R^1$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, and urethane. These groups can improve the solubility of the monomer and the resulting polymer. In some embodiments, both $R^1$ together form a 6- or 7-membered alicyclic ring, which is further substituted with an alkyl group. In some embodiments, both $R^1$ together form a 6- or 7-membered alicyclic ring, which is further substituted with an alkyl group having at least 1 carbon atom.

In some embodiments, both $R^1$ together form a $-O-(CHY)_m-O-$ linkage, where m is 2 or 3, and Y is the same or different at each occurrence and is selected from the group consisting of hydrogen, alkyl, alcohol, benzyl, carboxylate, amidosulfonate, ether, ether carboxylate, ether sulfonate, ester sulfonate, and urethane. In one possible embodiment, at least one Y group is not hydrogen. In another possible embodiment, at least one Y group is a substituent having F substituted for at least one hydrogen. In a further possible embodiment, at least one Y group is perfluorinated.

In still other embodiments, the electrical contrasting agents used in the structures and methodologies described herein may be oligomers or polymers derived from aniline monomers of the type depicted in FORMULA 8 below:

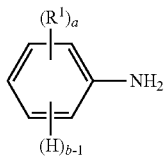

FORMULA 8 wherein:

a is 0 or an integer from 1 to 4;

b is an integer from 1 to 5, with the proviso that a+b=5; and $R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

When polymerized, the aniline monomeric unit can have FORMULA 9 or FORMULA 10 shown below, or a combination of both formulae:

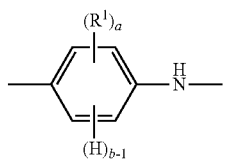

FORMULA 9

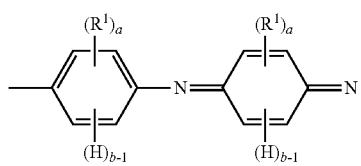

FORMULA 10 where a, b and $R^1$ are as defined above.

In some embodiments, the aniline monomer is unsubstituted and a=0. In other embodiments, a is not 0 and at least one $R^1$ is fluorinated. In one such embodiment, at least one $R^1$ is perfluorinated.

In still other embodiments, the electrical contrasting agents used in the structures and methodologies described herein may be oligomers or polymers derived from fused polycylic heteroaromatic monomers. In some such embodiments, the fused polycyclic heteroaromatic monomer is of a type depicted in FORMULA 11 below:

FORMULA 11

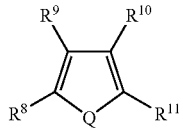

wherein:

Q is S, Se, Te, or $NR^6$;

$R^6$ is hydrogen or alkyl;

$R^8$, $R^9$, $R^{10}$, and $R^{11}$ are independently selected so as to be the same or different at each occurrence and are selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkyl sulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and at least one of $R^8$ and $R^9$, $R^9$ and $R^{10}$, and $R^{10}$ and $R^{11}$ together form an alkenylene chain completing a 5 or 6-membered aromatic ring, which ring may optionally include one or more divalent nitrogen, sulfur, selenium, tellurium, or oxygen atoms.

In still other embodiments, the electrical contrasting agents used in the structures and methodologies described herein may be oligomers or polymers derived from fused polycyclic heteroaromatic monomers of a type represented by FORMULAS 12, 13, 14, 15, 16, 17, and 18 below:

FORMULA 12

FORMULA 13

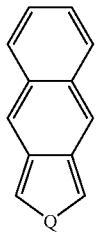

FORMULA 14

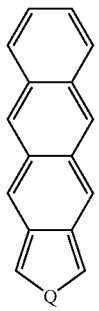

FORMULA 15

FORMULA 16

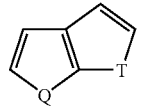

FORMULA 17

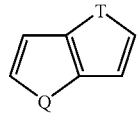

FORMULA 18

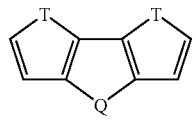

wherein:

Q is S, Se, Te, or NH; and

T is the same or different at each occurrence and is selected from S, $NR^6$, O, $SiR^6{}_2$, Se, Te, and $PR^6$;

$R^6$ is hydrogen or alkyl.

The fused polycyclic heteroaromatic monomers may be further substituted with groups selected from alkyl, heteroalkyl, alcohol, benzyl, carboxylate, ether, ether carboxylate, ether sulfonate, ester sulfonate, and urethane.

In some embodiments, the substituent groups may be fluorinated. In such embodiments, the substituent groups may be perfluorinated.

In some embodiments, the fused polycyclic heteroaromatic monomer may be a thieno(thiophene). The thieno (thiophene) may be selected, for example, from thieno(2,3-b)thiophene, thieno(3,2-b)thiophene, and thieno(3,4-b) thiophene. In some embodiments, the thieno(thiophene) monomer may be further substituted with at least one group selected from alkyl, heteroalkyl, alcohol, benzyl, carboxylate, ether, ether carboxylate, ether sulfonate, ester sulfonate, and urethane. The substituent groups may be fluorinated or perfluorinated.

In further embodiments, the electrical contrasting agents used in the structures and methodologies described herein may be oligomers or polymers derived from polycyclic heteroaromatic monomers of the type depicted in FORMULA 19 below:

FORMULA 19

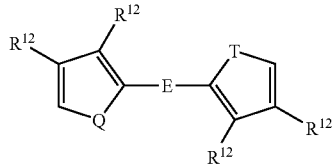

wherein:

Q is S, Se, Te, or $NR^6$;

T is selected from S, $NR^6$, O, $SiR^6{}_2$, Se, Te, and $PR^6$;

E is selected from alkenylene, arylene, and heteroarylene;

$R^6$ is hydrogen or alkyl;

$R^{12}$ is the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialky-lamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; or both $R^{12}$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms.

In some embodiments of the methodologies and devices described herein, the electrical contrasting agent may be an electrically conductive polymer which is a copolymer of a precursor monomer and at least one second monomer. The second monomer may be of various types, depending upon the desired properties of the copolymer. Possible types of such second monomers include, but are not limited to, alkenyl, alkynyl, arylene, and heteroarylene, fluorene, oxadiazole, thiadiazole, benzothiadiazole, phenylenevinylene, phenyleneethynylene, pyridine, diazines, and triazines, all of which may be further substituted.

In some embodiments of the methodologies and devices described herein, the electrical contrasting agent may be an electrically conductive polymer which is a copolymer of two or more precursor monomers. The precursor monomers may be, for example, thiophenes, selenophenes, tellurophenes, pyrroles, anilines, or polycyclic aromatic compounds.

Various optical contrasting agents may be used in the structures and methodologies described herein. One preferred class of optical contrasting agents includes fluorescent dyes which fluoresce at the actinic radiation used for inspection. TABLE 1 below lists some fluorescent dyes which may be used for this purpose. One skilled in the art will appreciate, of course, that the choice of dye may depend on the particular wavelength of actinic radiation being utilized by the inspection tool.

TABLE 1

Fluorescent Dyes

| Name | Structure |
|---|---|
| 7-amino-3-[2-[(2,5-dioxo-1-pyrrolidinyl)oxy]-2-oxoethyl]-4-methyl-2-oxo-2H-1-Benzopyran-6-sulfonic acid | 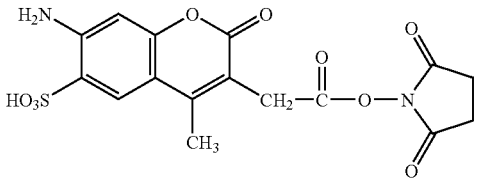 |
| ALEXA FLUOR ® 430 carboxylic acid, succinimidyl ester | 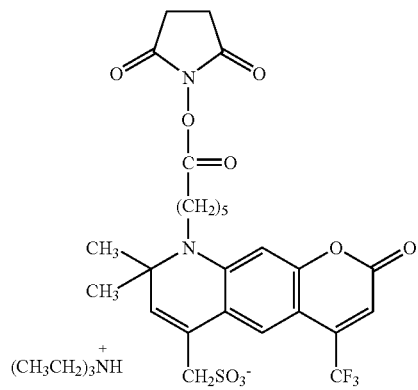 |
| ALEXA FLUOR ® 488 carboxylic acid, succinimidyl ester | 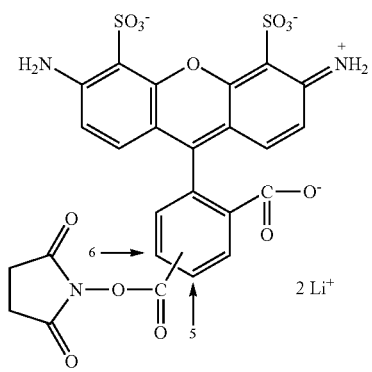 |

TABLE 1-continued

Fluorescent Dyes

| Name | Structure |
|---|---|
| 5-[4-[[(2,5-dioxo-1-pyrrolidinyl)oxy]carbonyl]phenyl]-2,3,7,8-tetrahydro-2,3,3,7,7,8-hexamethyl-1H-Pyrano[3,2-f:5,6-f']diindole-10,12-disulfonic acid | |
| Benzoic acid, 2,3,5-trichloro-4-[[2-[[6-[(2,5-dihydro-2,5-dioxo-1H-pyrrol-1-yl)oxy]-6-oxohexyl]amino]-2-oxoethyl]thio]-6-[1,3,4,8,9,10-hexahydro-2,2,4,8,10,10-hexamethyl-12,14-disulfo-2H-pyrano[3,2-g:5,6-g']diquinolin-6-yl]-, monosodium salt | |
| Benzenedicarboxylic acid, [1,10-dihydro-2,2,10,10-tetramethyl-4,8-bis(sulfomethyl)-2H-pyrano[3,2-g:5,6-g']diquinolin-6-yl]-, compd. with N-ethyl-N-(1-methylethyl)-2-propanamine (1:1) | |
| Pyrano[3,2-g:5,6-g']diquinolin-13-ium, 6-[2-carboxy-4(or 5)-[[(2,5-dioxo-1-pyrrolidinyl)oxy]carbonyl]phenyl]-1,2,10,11-tetrahydro-1,2,2,10,10,11-hexamethyl-4,8-bis(sulfomethyl)-, inner salt | |

TABLE 1-continued
Fluorescent Dyes
| Name | Structure |
|---|---|
| ALEXA FLUOR ® 405 carboxylic acid, succinimidyl ester | 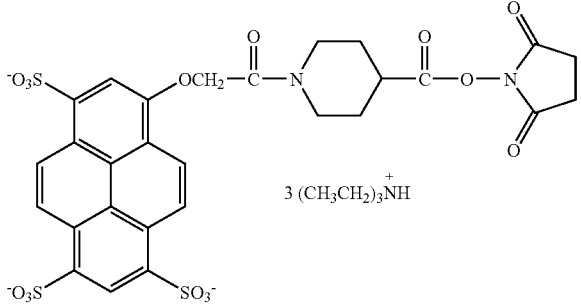 |
| ALEXA FLUOR ® 514 carboxylic acid, succinimidyl ester | 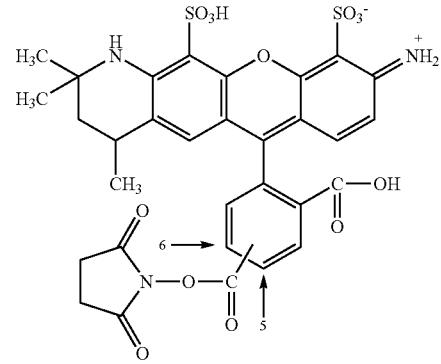 |
| ALEXA FLUOR ® 488 carboxylic acid, 2,3,5,6-tetrafluorophenyl ester (Alexa Fluor ® 488 5-TFP | 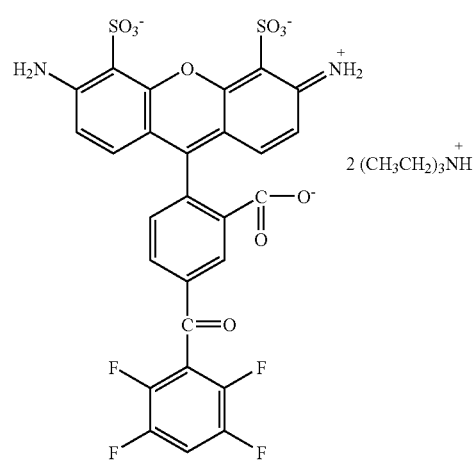 |
| ALEXA FLUOR ® 610-X, succinimidyl ester, bis(triethylammonium salt) | 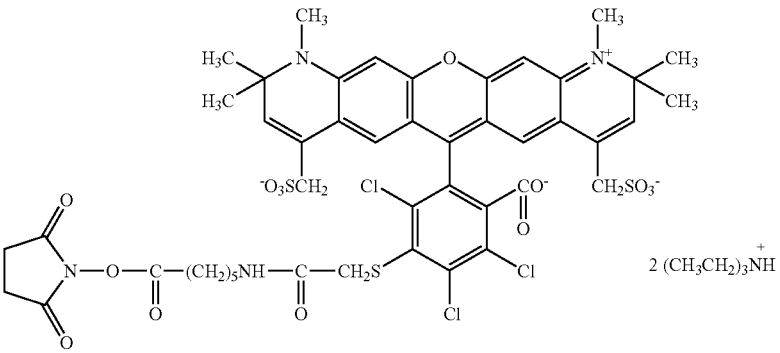 |

TABLE 1-continued

Fluorescent Dyes

| Name | Structure |
|---|---|
| ALEXA FLUOR ® 488 5-SDP ester (Alexa Fluor ® 488 sulfodichlorophenyl ester) | |
| Bis[4-(dimethylamino)phenyl] or methaniminium chloride | |
| N,N,N',N'-tetramethylacridine-3,6-diamine | |
| Acridine yellow, also known as acridine yellow G, acridine yellow H107, basic yellow K, and 3,6-diamino-2,7-dimethylacridine, is a yellow dye with strong bluish-violet fluorescence. It is a derivate of acridine. (2,7-dimethylacridine-3,6-diamine) | |
| Benzanthrenone | |
| 9,10-Bis(2-phenylethynyl)anthracene | |

TABLE 1-continued

Fluorescent Dyes

| Name | Structure |
|---|---|
| 5,12-Bis(phenylethynyl)naphthacene | |
| Calcein | |
| 2-Chloro-9,10-bis(2-phenylethynyl)anthracene | |
| 2-chromenone | |
| Cyanine dyes; family includes<br>I = Streptocyanines,<br>II = Hemicyanines,<br>III = Closed cyanine | |
| 2-(4-amidinophenyl)-1H-indole-6-carboxamidine | |

TABLE 1-continued
Fluorescent Dyes
| Name | Structure |
|---|---|
| 3,8-Diamino-5-ethyl-6-phenylphenanthridinium bromide | 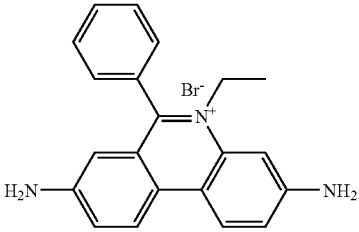 |
| Fluorescein | 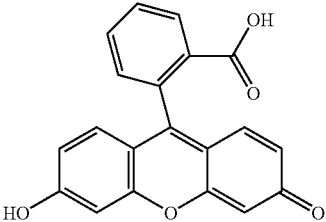 |
| Fura-2 | 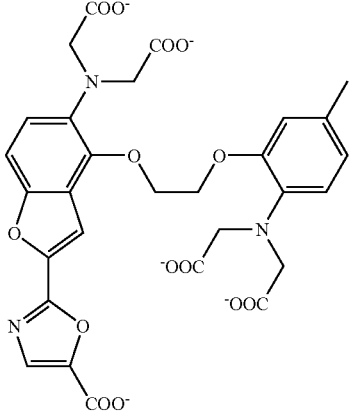 |
| acetoxymethyl 2-[5-[bis[acetoxymethoxy-oxo-methyl)methyl]amino]-4-[2-[2-[bis[(acetoxymethoxy-oxo-methyl)methyl]amino]-5-methyl-phenoxy]ethoxy]benzofuran-2-yl]oxazole-5-carboxylate | 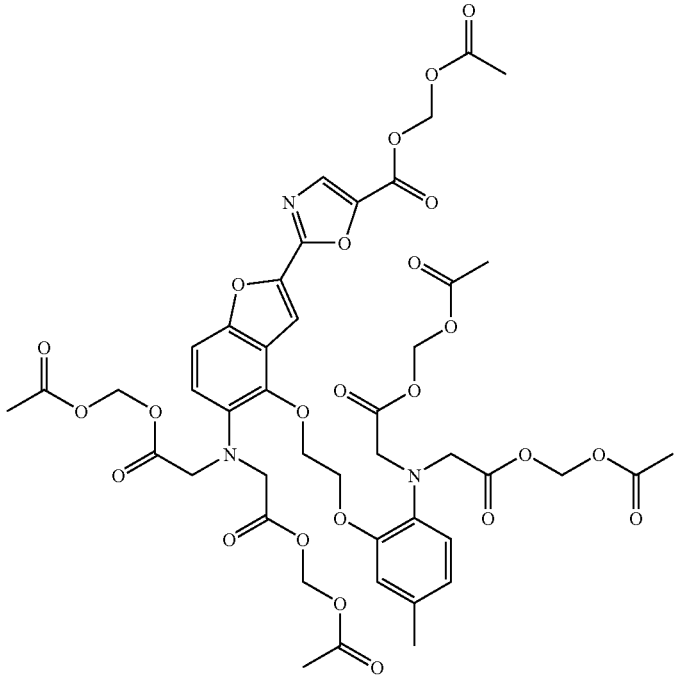 |

TABLE 1-continued
Fluorescent Dyes
| Name | Structure |
|---|---|
| Hoechst Stain | 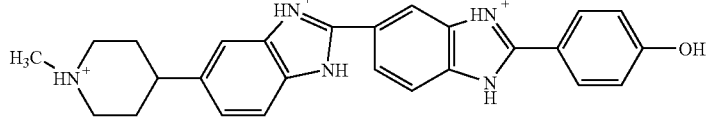 |
| Hoechst Stain | 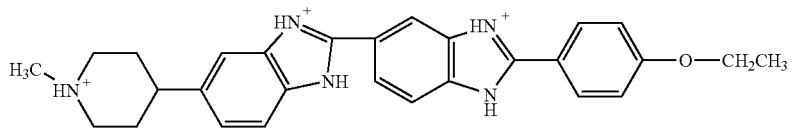 |
| 2-(4-amidinophenyl)-1H-indole-6-carboxamidine | 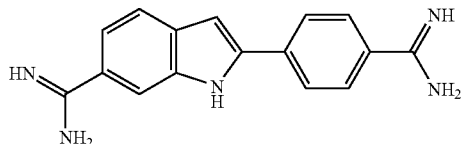 |
| Euxanthic acid | 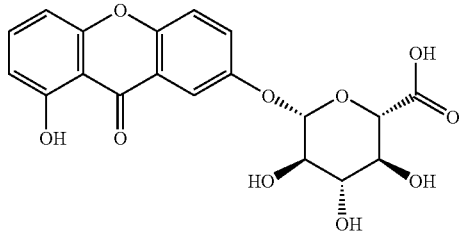 |
| Luciferins | 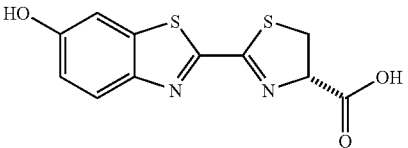 |
| Perylene | 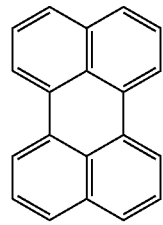 |
| Phycoerythrobilin | 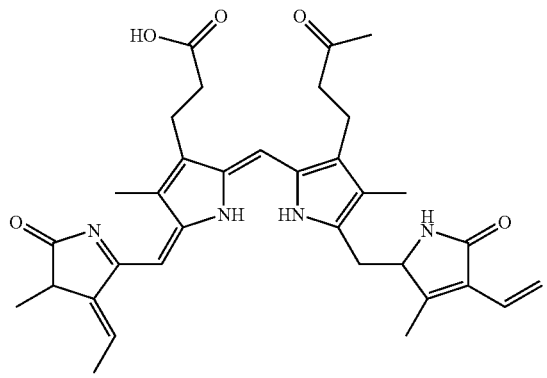 |

TABLE 1-continued

Fluorescent Dyes

| Name | Structure |
|---|---|
| Phycourobilin, or 3-[2-[(Z)-[3-(2-carboxyethyl)-5-[[(2R)-4-ethyl-3-methyl-5-oxo-1,2-dihydropyrrol-2-yl]methyl]-4-methyl-2-pyrrolylidene]methyl]-5-[[(2S)-3-ethyl-4-methyl-5-oxo-1,2-dihydropyrrol-2-yl]methyl]-4-methyl-1H-pyrrol-3-yl]propanoic acid | |
| Propidium Iodide | |
| Pyranine, or trisodium 8-hydroxypyrene-1,3,6-trisulfonate | |
| Rhodamine 6G (a fluoranone dye) | |
| Rhodamine B (a fluoranone dye) | |

TABLE 1-continued

Fluorescent Dyes

| Name | Structure |
|---|---|
| SYBR Green I (SG) (an asymmetrical cyanine dye) | |
| Stilbene (trans-1,2-diphenylethylene | |
| Sulforhodamine 101 | |
| "Texas Red" or sulforodamine 101 acid chloride | |
| 6-Methoxy-(8-p-toluenesulfonamido)quinoline (TSQ) | |

TABLE 1-continued

Fluorescent Dyes

| Name | Structure |
|---|---|
| 7-hydroxycoumarin | 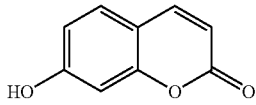 |

Various non-fluorescent dyes may also be utilized as optical contrasting agents in the structures and methodologies described herein. Preferably, such dyes provide a sufficient difference in the absorption of actinic radiation to allow a layer containing the dye to be distinguished from an adjacent layer which does not contain the dye. In such embodiments, the difference in absorption of actinic radiation between the layer containing the dye and an adjacent layer not containing the dye is preferably at least 5%, more preferably at least 15%, and most preferably at least 30%.

The dyes utilized as optical contrasting agents in the structures and methodologies described herein may also operate by providing a difference in indices of refraction between two adjacent layers along one or more optical axis. In such embodiments, this difference in indices of refraction will preferably be at least 0.05, more preferably at least 0.10, and most preferably at least 0.20 along at least one axis, and preferably along two mutually orthogonal axes parallel to the major planes of the films.

One skilled in the art will appreciate that various chemical substitutions and modifications may be made to any of the above-noted dyes to produce additional dyes that may be suitable for use as optical contrasting agents in the devices and methodologies described herein. These include, for example, various acids and salts of the foregoing materials. Also, various unsymmetrical cyanine dyes may be synthesized for this purpose which incorporate aza-benzazolium ring moieties, including cyanine dyes substituted by a cationic side chain, monomeric and dimeric cyanine dyes, chemically reactive cyanine dyes, and conjugates of cyanine dyes.

It will further be appreciated that, with many of these materials, the chemical environments of the dye may have a significant impact on the optical properties of the dye, including, for example, the ability of the dye to exhibit fluorescence and the wavelength(s) at which such fluorescence primarily occurs. Thus, it will be appreciated that the chemistry (including, for example, the pH) of the photoresist incorporating the dye may be controlled or modified to achieve the desired optical properties.

Since the material of the planarizing layer in a bilayer photoresist (unlike the material of the imaging layer) is typically not photosensitive and is typically not developed out during the imaging process, small chemical changes may typically be made to this layer without upsetting the imaging properties of the process. Hence, it is preferred to incorporate the contrasting agent into the planarizing layer. Nonetheless, one skilled in the art will appreciate that embodiments are possible in accordance with the teachings herein in which the contrasting agent is incorporated instead into the imaging layer, or into both the planarizing layer and the imaging layer. Embodiments are also possible in accordance with the teachings herein in which different contrasting agents are incorporated in to the imaging layer and the planarizing layer.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for patterning a substrate, comprising:
providing a substrate;
applying a first layer, comprising a first photoresist, to the substrate;
applying a second layer, comprising a second photo resist, over the first layer;
patterning the second layer; and
inspecting the patterned second layer with an inspection tool;
wherein at least one of the first and second layers comprises a contrasting agent which increases the contrast between the first and second layers to the inspection tool.

2. The method of claim 1, wherein the inspection tool is an e-beam inspection tool, wherein the contrasting agent is an electrically conductive material, and wherein the contrast is electrical contrast.

3. The method of claim 2, wherein the electrically conductive material is an electrically conductive oligomer or polymer.

4. The method of claim 3, wherein the electrically conductive material is a polymer selected from the group consisting of polyaniline salts, polyaniline bases, polypyrroles and polythiophenes.

5. The method of claim 3, wherein the electrically conductive material is a polymer derived from the monomer

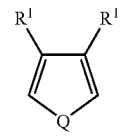

wherein:
Q is selected from the group consisting of S, Se, and Te; and
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent species such as nitrogen, selenium, tellurium, sulfur or oxygen atoms.

6. The method of claim 3, wherein the electrically conductive material is a polymer derived from the monomer

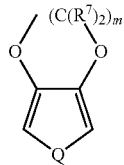

wherein:
Q is selected from the group consisting of S, Se, and Te; and
$R^7$ is the same or different at each occurrence and is selected from the group consisting of hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, and m is 2 or 3.

7. The method of claim 3, wherein the electrically conductive material is a polymer derived from the monomer

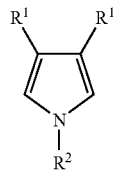

wherein:
$R^1$ is independently selected so as to be the same or different at each occurrence and is selected from the group consisting of hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms; and
$R^2$ is independently selected so as to be the same or different at each occurrence and is selected from the group consisting of hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

8. The method of claim 3, wherein the electrically conductive material is a polymer derived from the monomer

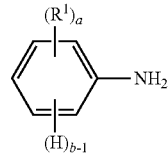

wherein:
a is 0 or an integer from 1 to 4;
b is an integer from 1 to 5, with the proviso that a+b=5; and
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

9. The method of claim 3, wherein the electrically conductive material is a polymer derived from a monomer selected from the group consisting of monomer A and monomer B as defined below:

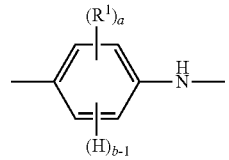

Monomer A

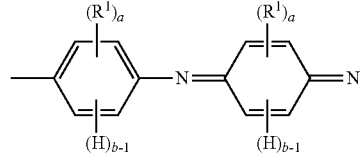

Monomer B wherein:
a is 0 or an integer from 1 to 4;
b is an integer from 1 to 5, with the proviso that a+b=5; and
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

10. The method of claim 3, wherein the electrically conductive material is a polymer derived from the monomer

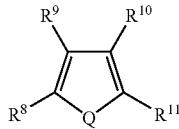

wherein:

Q is S, Se, Te, or $NR^6$;

$R^6$ is hydrogen or alkyl;

$R^8$, $R^9$, $R^{10}$, and $R^{11}$ are independently selected so as to be the same or different at each occurrence and are selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkyl sulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and at least one of $R^8$ and $R^9$, $R^9$ and $R^{10}$, and $R^{10}$ and $R^{11}$ together form an alkenylene chain completing a 5 or 6-membered aromatic ring, which ring may optionally include one or more divalent nitrogen, sulfur, selenium, tellurium, or oxygen atoms.

11. The method of claim 3, wherein the electrically conductive material is a polymer derived from a monomer selected from the group consisting of monomers A, B, C, D, E, F and G as defined below:

Monomer A

Monomer B

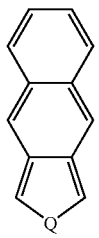

Monomer C

Monomer D

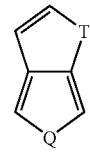

Monomer E

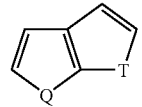

Monomer F

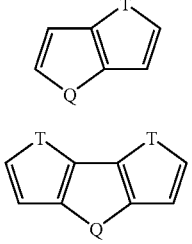

Monomer G wherein:

Q is S, Se, Te, or NH;

T is the same or different at each occurrence and is selected from S, $NR^6$, 0, $SiR^6_2$, Se, Te, and $PR^6$; and $R^6$ is hydrogen or alkyl.

12. The method of claim 1, wherein the inspection tool is an optical inspection tool, wherein the contrasting agent is a dye, and wherein the contrast is optical contrast.

13. The method of claim 12, wherein the contrasting agent is a fluorescent dye.

14. The method of claim 13, wherein the optical inspection tool utilizes a wavelength of actinic radiation, and wherein the fluorescent dye fluoresces at the wavelength of actinic radiation utilized by the inspection tool.

15. The method of claim 13, wherein the fluorescent dye is disposed in the planarizing layer.

16. The method of claim 13, wherein the dye is selected from the group consisting of anthracene dyes, fluoranone dyes and cyanine dyes.

17. The method of claim 13, wherein the dye is selected from the group consisting of methaniminium chloride, N,N,N',N'-tetramethylacridine-3,6-diamine, benzanthrenone, 9,10-Bis(2-phenylethynyl)anthracene, 5,12-Bis(phenylethynyl)naphthacene, calcein, 2-chloro-9,10-bis(2-phenylethynyl)anthracene, 2-chromenone, 2-(4-amidinophenyl)-1H-indole-6-carboxamidine, 3,8-Diamino-5-ethyl-6-phenylphenanthridinium bromide, fluorescein, 2-(4-amidinophenyl)-1H -indole-6-carboxamidine, euxanthic acid, luciferins, perylene, phycoerythrobilin, phycourobilin, propidium iodide, trisodium 8-hydroxypyrene-1,3,6-trisulfonate, rhodamine 6G, rhodamine B, SYBR Green I, trans-1, 2-diphenylethylene, sulforhodamine 101, sulforhodamine 101 acid chloride, 6-Methoxy-(8-p-toluenesulfonamido) quinoline (TSQ), and 7-hydroxycoumarin.

18. The method of claim 1, wherein the difference in absorption between the first and second layers of the actinic radiation utilized by the inspection tool is at least 5%.

19. The method of claim 1, wherein the difference in indices of refraction between the first and second layer is at least 0.05 along at least one axis.

20. The method of claim 1 wherein, if the inspection tool is an optical inspection tool, the contrast is a difference in adsorption of the actinic radiation, and if the inspection tool is an e-beam inspection tool, the contrast is a difference in dielectric constant.

21. The method of claim 3, wherein the contrasting agent is in the first layer, and wherein the first layer is a planarizing layer.

22. The method of claim 1, wherein the substrate is a semiconductor wafer.

23. The method of claim 1, further comprising using the patterned second layer as an etch mask in an etching process to transfer the pattern from the second layer to the first layer, and wherein the etching process occurs after the patterned second layer is inspected.

* * * * *